US008207062B2

(12) United States Patent
Gao et al.

(10) Patent No.: US 8,207,062 B2
(45) Date of Patent: Jun. 26, 2012

(54) METHOD FOR IMPROVING ADHESION OF LOW RESISTIVITY TUNGSTEN/TUNGSTEN NITRIDE LAYERS

(75) Inventors: Juwen Gao, Fremont, CA (US); Wei Lei, Santa Clara, CA (US); Michal Danek, Cupertino, CA (US); Erich Klawuhn, Los Altos, CA (US); Sean Chang, Cupertino, CA (US); Ron Powell, Portola Valley, CA (US)

(73) Assignee: Novellus Systems, Inc., San Jose, CA (US)

( * ) Notice: Subject to any disclaimer, the term of this patent is extended or adjusted under 35 U.S.C. 154(b) by 217 days.

(21) Appl. No.: 12/556,490

(22) Filed: Sep. 9, 2009

(65) Prior Publication Data

US 2011/0059608 A1    Mar. 10, 2011

(51) Int. Cl.
*H01L 21/4763* (2006.01)
(52) U.S. Cl. ........ 438/648; 438/656; 438/680; 438/685; 427/537; 257/E21.584
(58) Field of Classification Search .................. 438/680, 438/627–628, 644, 648, 653–654, 656, 685; 427/455, 533, 537; 257/E21.584
See application file for complete search history.

(56) References Cited

U.S. PATENT DOCUMENTS

| 4,746,375 A | 5/1988 | Lacovangelo |
| 4,804,560 A | 2/1989 | Shioya et al. |
| 5,028,565 A | 7/1991 | Chang et al. |
| 5,227,329 A | 7/1993 | Kobayashi et al. |
| 5,250,329 A | 10/1993 | Miracky et al. |
| 5,326,723 A | 7/1994 | Petro et al. |
| 5,391,394 A | 2/1995 | Hansen |
| 5,661,080 A | 8/1997 | Hwang et al. |
| 5,726,096 A | 3/1998 | Jung |
| 5,795,824 A | 8/1998 | Hancock |
| 5,804,249 A | 9/1998 | Sukharev et al. |
| 5,817,576 A | 10/1998 | Tseng et al. |
| 5,926,720 A | 7/1999 | Zhao et al. |
| 5,956,609 A | 9/1999 | Lee et al. |
| 6,001,729 A | 12/1999 | Shinriki et al. |
| 6,017,818 A | 1/2000 | Lu |
| 6,037,263 A | 3/2000 | Chang |
| 6,066,366 A | 5/2000 | Berenbaum et al. |
| 6,099,904 A | 8/2000 | Mak et al. |
| 6,107,200 A | 8/2000 | Takagi et al. |

(Continued)

FOREIGN PATENT DOCUMENTS

WO    WO01/27347    4/2001

OTHER PUBLICATIONS

Lee et al., PCT Search Report, mailed Jan. 19, 2005, Application No. PCT/US2004/006940.

(Continued)

*Primary Examiner* — Thanhha Pham
(74) *Attorney, Agent, or Firm* — Weaver Austin Villeneuve & Sampson LLP

(57) ABSTRACT

Methods of improving the adhesion of low resistivity tungsten/tungsten nitride layers are provided. Low resistivity tungsten/tungsten nitride layers with good adhesion are formed by treating a tungsten or tungsten nitride layer before depositing low resistivity tungsten. Treatments include a plasma treatment and a temperature treatment. According to various embodiments, the treatment methods involve different gaseous atmospheres and plasma conditions.

15 Claims, 6 Drawing Sheets

U.S. PATENT DOCUMENTS

| | | | |
|---|---|---|---|
| 6,143,082 A | 11/2000 | McInerney et al. | |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,265,312 B1 | 7/2001 | Sidhwa et al. | |
| 6,277,744 B1 | 8/2001 | Yuan et al. | |
| 6,294,468 B1 | 9/2001 | Gould-Choquette et al. | |
| 6,297,152 B1 | 10/2001 | Itoh et al. | |
| 6,309,966 B1 | 10/2001 | Govindarajan et al. | |
| 6,355,558 B1 | 3/2002 | Dixit et al. | |
| 6,404,054 B1 | 6/2002 | Oh et al. | |
| 6,465,347 B2 | 10/2002 | Ishizuka et al. | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,905,543 B1 | 6/2005 | Fair et al. | |
| 6,908,848 B2 | 6/2005 | Koo | |
| 6,936,538 B2 | 8/2005 | Byun | |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 | 11/2006 | Lee et al. | |
| 7,157,798 B1 | 1/2007 | Fair et al. | |
| 7,211,144 B2 | 5/2007 | Lu et al. | |
| 7,220,671 B2 | 5/2007 | Simka et al. | |
| 7,262,125 B2 | 8/2007 | Wongsenakhum et al. | |
| 7,416,979 B2 | 8/2008 | Yoon et al. | |
| 7,429,402 B2 | 9/2008 | Gandikota et al. | |
| 7,589,017 B2 | 9/2009 | Chan et al. | |
| 7,655,567 B1 | 2/2010 | Gao et al. | |
| 7,691,749 B2 | 4/2010 | Levy et al. | |
| 7,754,604 B2 | 7/2010 | Wongsenakhum et al. | |
| 7,772,114 B2 | 8/2010 | Chan et al. | |
| 7,955,972 B2 | 6/2011 | Chan et al. | |
| 2001/0008808 A1 | 7/2001 | Gonzalez | |
| 2001/0014533 A1 | 8/2001 | Sun | |
| 2001/0015494 A1 | 8/2001 | Ahn | |
| 2001/0044041 A1 | 11/2001 | Badding et al. | |
| 2002/0090796 A1 | 7/2002 | Desai et al. | |
| 2002/0177316 A1 | 11/2002 | Miller et al. | |
| 2003/0059980 A1 | 3/2003 | Chen et al. | |
| 2003/0104126 A1 | 6/2003 | Fang et al. | |
| 2003/0127043 A1 | 7/2003 | Lu et al. | |
| 2004/0014315 A1 | 1/2004 | Lai et al. | |
| 2004/0044127 A1 | 3/2004 | Okubo et al. | |
| 2004/0142557 A1* | 7/2004 | Levy et al. | 438/680 |
| 2004/0202786 A1 | 10/2004 | Wongsenakhum et al. | |
| 2004/0206267 A1 | 10/2004 | Sambasivan et al. | |
| 2005/0031786 A1 | 2/2005 | Lee et al. | |
| 2005/0059236 A1* | 3/2005 | Nishida et al. | 438/655 |
| 2005/0136594 A1 | 6/2005 | Kim | |
| 2006/0094238 A1 | 5/2006 | Levy et al. | |
| 2007/0099420 A1 | 5/2007 | Dominquez et al. | |
| 2007/0190780 A1 | 8/2007 | Chung et al. | |
| 2008/0081127 A1 | 4/2008 | Thompson et al. | |
| 2008/0124926 A1 | 5/2008 | Chan et al. | |
| 2008/0254623 A1 | 10/2008 | Chan et al. | |
| 2008/0280438 A1 | 11/2008 | Lai et al. | |
| 2009/0149022 A1 | 6/2009 | Chan et al. | |
| 2009/0163025 A1 | 6/2009 | Humayun et al. | |
| 2010/0035427 A1 | 2/2010 | Chan et al. | |
| 2010/0055904 A1 | 3/2010 | Chen et al. | |
| 2010/0159694 A1 | 6/2010 | Chandrashekar et al. | |
| 2010/0267230 A1 | 10/2010 | Chandrashekar et al. | |
| 2010/0267235 A1 | 10/2010 | Chen et al. | |
| 2010/0273327 A1 | 10/2010 | Chan et al. | |

OTHER PUBLICATIONS

Lee et al., Written Opinion mailed Jan. 19, 2005, Application No. PCT/US2004/006940.

George et al., "Surface Chemistry for atomic Layer Growth", J. Phys. Chem, 1996, vol. 100, no, 31, pp. 13121-13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 Pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten for Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea 2003, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

Wongsenakhum et al., "Method of Forming Low-Resistivity Tungsten Interconnects," Novellus Systems, Inc., U.S. Appl. No. 10/815,560, filed Mar. 31, 2004.

U.S. Office Action mailed Jul. 12, 2005, from U.S. Appl. No. 10/815,560.

Lee et al., "Method for Producing Ultra Thin Tungsten Layer With Improved Step Coverage," Novellus Systems, Inc., U.S. Appl. No. 09/975,074, filed Oct. 9, 2001.

U.S. Office Action mailed Jul. 17, 2002, from U.S. Appl. No. 09/975,074.

Lee et al., "Method for Producing Ultra Thin Tungsten Layer With Improved Step Coverage," Novellus Systems, Inc., U.S. Appl. No. 10/649,351, filed Aug. 26, 2003.

U.S. Office Action mailed Feb. 8, 2005, from U.S. Appl. No. 10/649,351.

U.S. Final Office Action mailed Jul. 14, 2005, from U.S. Appl. No. 10/649,351.

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

Fair et al., "Selective Refractory Metal and Nitride Capping," Novellus Systems, Inc., U.S. Appl. No. 10/435,010, filed May 9, 2003.

U.S. Office Action mailed Jun. 22, 2004, from U.S. Appl. No. 10/435,010.

Levy et al., "Deposition of Tungsten Nitride," Novellus Systems, Inc., U.S. Appl. No. 10/690,492, filed Oct. 20, 2003.

U.S. Office Action mailed Mar. 23, 2005, from U.S. Appl. No. 10/690,492.

Fair et al., "Selective Refractory Metal and Nitride Capping," Novellus Systems, Inc., U.S. Appl. No. 10/984,126, filed Nov. 8, 2004.

U.S. Office Action mailed Nov. 23, 2005, from U.S. Appl. No. 10/984,126.

Levy et al., "Deposition of Tungsten Nitride", Novellus Systems, Inc., filed Dec. 16, 2005, U.S. Appl. No. 11/305,368, pp. 1-39.

U.S. Final Office Action mailed Dec. 28, 2005, from U.S. Appl. No. 10/815,560.

U.S. Office Action mailed Dec. 30, 2005, from U.S. Appl. No. 10/649,351.

Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.

U.S. Office Action mailed Apr. 17, 2006, from U.S. Appl. No. 10/815,560.

U.S. Final Office Action mailed May 17, 2006, from U.S. Appl. No. 10/984,126.

U.S. Office Action mailed Sep. 28, 2006, from U.S. Appl. No. 10/815,560.

Gao et al., "Methods for Improving Uniformity and Resistivity of Thin Tungsten Films," Novellus Systems, Inc, filed Jul. 24, 2007, U.S. Appl. No. 11/782,570, pp. 1-23.

Chan et al., "Methods for Growing Low-Resistivity Tungsten for High Aspect Ratio and Small Features," Novellus Systems, Inc., U.S. Appl. No. 12/030,645, filed Feb. 13, 2008.

Humayun et al., "Methods for Forming All Tungsten Contacts and Lines," Novellus Systems, Inc., U.S. Appl. No. 11/963,698, filed Dec. 21, 2007.

Chan et al., "Method for Improving Uniformity and Adhesion of Low Resistivity Tungsten Film," Novellus Systems, Inc., U.S. Appl. No. 11/951,236, filed Dec. 5, 2007.

Notice of Allowance and Fee Due mailed Mar. 12, 2003, from U.S. Appl. No. 09/975,074.

Allowed Claims from U.S. Appl. No. 09/975,074.

Notice of Allowance and Fee Due mailed Jul. 21, 2006, from U.S. Appl. No. 10/649,351.

Allowed Claims from U.S. Appl. No. 10/649,351.

Notice of Allowance and Fee Due mailed Oct. 7, 2004, from U.S. Appl. No. 10/435,010.

Allowed Claims from U.S. Appl. No. 10/435,010.

Notice of Allowance and Fee Due mailed Aug. 25, 2006, from U.S. Appl. No. 10/984,126.

Allowed Claims from U.S. Appl. No. 10/984,126.

Notice of Allowance and Fee Due mailed Sep. 14, 2005, from U.S. Appl. No. 10/690,492.

Allowed Claims from U.S. Appl. No. 10/690,492.

Notice of Allowance and Fee Due mailed Apr. 24, 2007, from U.S. Appl. No. 10/815,560.

Allowed Claims from U.S. Appl. No. 10/815,560.

U.S. Office Action mailed Jun. 27, 2008, from U.S. Appl. No. 11/305,368.

Chan et al., "Methods for Growing Low-Resistivity Tungsten Film," Novellus Systems, Inc., U.S. Appl. No. 11/265,531, filed Nov. 1, 2005.

U.S. Office Action mailed Aug. 21, 2008, from U.S. Appl. No. 11/265,531.

Ashtiani et al., "Ternary Tungsten-Containing Thin Film Heater Elements," Novellus Systems, Inc., U.S. Appl. No. 61/025,237, filed Jan. 31, 2008.

Chen et al., "Method for Reducing Tungsten Roughness and Improving Reflectivity," Novellus Systems, Inc., U.S. Appl. No. 12/202,126, filed Aug. 29, 2008.

U.S. Office Action mailed Oct. 16, 2008, from U.S. Appl. No. 11/349,035.

U.S. Office Action mailed Sep. 29, 2008, from U.S. Appl. No. 11/782,570.

Ashtiani et al., "Ternary Tungsten-Containing Thin Films," Novellus Systems, Inc., U.S. Appl. No. 12/363,330, filed Jan. 30, 2009.

Chandrashekar et al., "Method for depositing thin tungsten film with low resistivity and robust micro-adhesion characteristics," Novellus Systems, Inc., U.S. Appl. No. 61/061,078, filed Jun. 12, 2008.

U.S. Final Office Action mailed Apr. 28, 2009, from U.S. Appl. No. 11/782,570.

U.S. Office Action mailed Apr. 3, 2009, from U.S. Appl. No. 11/305,368.

U.S. Final Office Action mailed Feb. 26, 2009, from U.S. Appl. No. 11/265,531.

U.S. Notice of Allowance mailed May 4, 2009 from U.S. Appl. No. 11/265,531.

Allowed Claims from U.S. Appl. No. 11/265,531.

U.S. Final Office Action mail Feb. 25, 2009, from U.S. Appl. No. 11/349,035.

U.S. Office Action mailed Jun. 11, 2009, from U.S. Appl. No. 11/963,698.

U.S. Office Action mailed Jun. 4, 2009, from U.S. Appl. No. 11/349,035.

Ken K. Lai and H. Henry Lamb, Precursors for Organometallic Chemical Vapor Deposition of Tungsten Carbide Films, 1995, Chemistry Material, pp. 2284-2292.

U.S. Office Action mailed Jun. 24, 2009 from U.S. Appl. No. 12/030,645.

U.S. Office Action mailed Aug. 5, 2009, from U.S. Appl. No. 11/951,236.

Ashtiani et al., "Ternary Tungsten-Containing Resistive Thin Films," Novellus Systems, Inc., U.S. Appl. No. 12/363,330, filed Jan. 30, 2009.

Chandrashekar et al., "Method for Depositing Thin Tungsten Film With Low Resistivity and Robust Micro-Adhesion Characteristics," Novellus Systems, Inc., U.S. Appl. No. 12/407,541, filed Mar. 19, 2009.

U.S. Office Action mailed Oct. 21, 2009 from U.S. Appl. No. 12/202,126.

U.S. Notice of Allowance mailed Nov. 17, 2009 from U.S. Appl. No. 11/305,368.

Allowed Claims from U.S. Appl. No. 11/305,368.

U.S. Final Office Action mailed Nov. 20, 2009 from U.S. Appl. No. 11/349,035.

U.S. Final Office Action mailed Dec. 9, 2009 from U.S. Appl. No. 11/963,698.

U.S. Notice of Allowance mailed Sep. 17, 2009 from U.S. Appl. No. 11/782,570.

Allowed Claims from U.S. Appl. No. 11/782,570.

Chan et al., "Methods for Growing Low-Resistivity Tungsten Filml", Novellus Systems Inc., U.S. Appl. No. 12/538,770, filed Aug. 10, 2009.

U.S. Final Office Action mailed Jan. 13, 2010 from U.S. Appl. No. 12/030,645.

Gao et al., "Methods for Improving Uniformity and Resistivity of Thin Tungsten Films," Novellus Systems, Inc, filed Dec. 11, 2009, U.S. Appl. No. 12/636,616.

U.S. Office Action mailed Jan. 26, 2010 from U.S. Appl. No. 11/951,236.

Lee el al., PCT Search Report, Completed Oct. 15, 2004, PCT/US2004/006940, Int'l filing date May 3, 2004.

Lee et al., Written Opinion, Completed Oct. 15, 2004, PCT/US2004/006940, Int'l filing date May 3, 2004.

George et al., "Surface Chemistry for atomic Layer Growth", J. Phys. Chem, 1996, vol. 100, No. 31, pp. 13121-13131.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

U.S. Office Action mailed Jul. 14, 2005, from U.S. Appl. No. 10/649,351.

Chan et al., "Methods for Growing Low-Resistivity Tungsten Film", Novellus Systems, Inc., filed Nov. 1, 2005, U.S. Appl. No. 11/265,531, pp. 1-35.

U.S. Office Action mailed Dec. 28, 2005, from U.S. Appl. No. 10/815,560.

U.S. Office Action mailed May 17, 2006, from U.S. Appl. No. 10/984,126.

Notice of Allowance and Fee Due mailed Mar. 12, 2003, from U.S. Appl No. 09/975,074.

Notice of Allowance and Fee Due mailed Sep. 14, 2005, from U.S. Appl.No. 10/690,492.

U.S. Notice of Allowance mailed Mar. 2, 2010 from U.S. Appl. No. 11/349,035.

Allowed Claims from U.S. Appl. No. 11/349,035, Mar. 2010.

Danek, et al, "Tungsten Barrier and Seed for Copper Filled TSV," Novellus Systems, Inc., filed Mar. 12, 2010, U.S. Appl. No. 12/723,532.

Chandrashekar, et al., "Method for Forming Tungsten Contacts and Interconnects with Small Critical Dimensions," Novellus Systems, Inc, filed Apr. 6, 2010, U.S. Appl. No. 12/755,248.

Chen, et al., "Methods for Depositing Ultra Thin Low Resistivity Tungsten Film for Small Critical Dimension Contacts and Interconnects," Novellus Systems, Inc, filed Apr. 6, 2010, U.S. Appl. No. 12/755,259.

U.S. Notice of Allowance and Allowed Claims mailed Apr. 6, 2010 from U.S. Appl. No. 11/951,236.

U.S. Office Action mailed May 3, 2010 from U.S. Appl. No. 12/407,541.

U.S. Final Office Action mailed May 7, 2010 from U.S. Appl. No. 12/202,126.

Chan et al., "Method for Improving Uniformity and Adhesion of Low Resistivity Tungsten Film," Novellus Systems, Inc., U.S. Appl. No. 12/829,119, filed Jul. 1, 2010.

U.S. Office Action mailed Jun. 11, 2010 from U.S. Appl. No. 11/963,698.

U.S. Final Office Action mailed Jul. 23, 2010 from U.S. Appl. No. 12/030,645.

U.S. Office Action mailed Jul. 26, 2010 from U.S. Appl. No. 12/202,126.

International Search Report and Written Opinion mailed Apr. 12, 2010 from Application No. PCT/US2009/055349.

Hoover, Cynthia, "Enabling Materials for Contact Metallization," Praxair Electronic Materials R&D, Jul. 2007, pp. 1-16.

Purchase of ethylcyclopentadienyl)dicarbonylnitrosyltungsten from Praxair in Oct. 2006.

U.S. Final Office Action mailed Oct. 19, 2010 from U.S. Appl. No. 12/407,541.

U.S. Office Action for U.S. Appl. No. 12/538,770 mailed Nov. 23, 2010.

U.S. Final Office Action for U.S. Appl. No. 11/963,698 mailed Dec. 30, 2010.

U.S. Office Action for U.S. Appl. No. 12/636,616 mailed Jan. 25, 2011.

U.S. Final Office Action mailed Feb. 7, 2011 from U.S. Appl. No. 12/202,126.

Notice of Allowance and Fee Due mailed Jan. 24, 2011, from U.S Appl. No. 12/030,645.

Allowed Claims from U.S Appl. No. 12/030,645 as of Jan. 24, 2011.

Chan et al., "Methods for Growing Low-Resistivity Tungsten for High Aspect Ratio and Small Features," Novellus Systems, Inc., U.S. Appl. No. 13/095,734, filed Apr. 27, 2011.

U.S. Office Action for U.S. Appl. No. 12/407,541 mailed May 2, 2011.

U.S. Office Action for U.S. Appl. No. 12/755,248 mailed May 13, 2011.

U.S. Final Office Action for U.S. Appl. No. 12/636,616 mailed Jun. 15, 2011.

Notice of Allowance for U.S. Appl. No. 12/538,770 mailed Jun. 30, 2011.

Allowed Claims as of Jun. 30, 2011, for U.S. Appl. No. 12/538,770.

U.S. Office Action for U.S. Appl. No. 12/829,119, mailed Jun. 30, 2011.

Notice of Allowance mailed Jul. 25, 2011, for U.S. Appl. No. 12/363,330.

Allowed Claims as of Jul. 25, 2011, for U.S. Appl. No. 12/363,330.

\* cited by examiner

METHOD FOR IMPROVING ADHESION OF LOW RESISTIVITY TUNGSTEN/TUNGSTEN NITRIDE LAYERS

BACKGROUND

Low resistivity metal layers minimize power losses and overheating in integrated circuit designs. Resistivity is an intrinsic property of a material and a measurement of a material's resistance to the movement of charge through the material. The resistivity of a material affects the electrical operation of an integrated circuit.

The deposition of tungsten layers using chemical vapor deposition (CVD) techniques is an integral part of many semiconductor fabrication processes. Tungsten layers may be used as low resistivity electrical connections in the form of horizontal interconnects, vias between adjacent metal layers, and contacts between a first metal layer and the devices on the silicon substrate.

It is desirable to use low resistivity tungsten layers in conjunction with tungsten nitride layers, the low resistivity tungsten layer being deposited on top of the tungsten nitride layer. The tungsten nitride layer provides relatively low resistivity, good adhesion to dielectric layers, and is a good diffusion barrier. Problems regarding the use of low resistivity tungsten layers with tungsten nitride layers, however, have prevented these materials from being used together in semiconductor devices.

SUMMARY OF INVENTION

Methods of forming low resistivity tungsten/tungsten nitride layers having good adhesion to the underlying layer are provided. Embodiments of the invention involve depositing a layer of tungsten or tungsten nitride on a substrate. This layer is treated to improve adhesion to the underlying substrate. According to various embodiments, treatments involve plasma or thermal treatments in a hydrogen or nitrogen-containing atmosphere. Then, a low resistivity tungsten layer is deposited on the tungsten or tungsten nitride layer. The resulting low resistivity tungsten/tungsten nitride stacks may be used in semiconductor device applications, including horizontal interconnects, vias, and contacts.

In one embodiment of the invention, a low resistivity tungsten layer is formed by (a) providing a semiconductor device substrate in a reaction chamber; (b) depositing a tungsten or tungsten nitride layer on the substrate; and (c) treating the deposited layer with a plasma containing nitrogen, hydrogen, or combinations thereof. After this, a low resistivity tungsten layer may be deposited on this deposited layer, which includes: (a) depositing a tungsten nucleation layer; (b) treating the tungsten nucleation layer to lower its resistivity; and (c) depositing a tungsten bulk layer on the nucleation layer by CVD.

In another embodiment of the invention, a low resistivity tungsten layer is formed by (a) providing a semiconductor device substrate in a reaction chamber; (b) depositing a layer of tungsten nitride with a CVD or a PNL process assisted by a nitrogen or hydrogen-containing plasma on the substrate; and (c) depositing a low resistivity tungsten layer by depositing a tungsten nucleation layer, treating the tungsten nucleation layer to lower its resistivity, and depositing a tungsten bulk layer on the nucleation layer by CVD.

In a further embodiment of the invention, a low resistivity tungsten layer is formed by (a) providing a semiconductor device substrate in a reaction chamber; (b) depositing a layer of tungsten or tungsten nitride material on the substrate; (c) treating the deposited layer to improve its adhesion to the substrate; and, (d) depositing a low resistivity tungsten layer by depositing a tungsten nucleation layer, treating the tungsten nucleation layer to lower its resistivity, and depositing a tungsten bulk layer on the tungsten nucleation layer by CVD.

These and other features and advantages of the invention will be described in more detail below with reference to the associated drawings.

BRIEF DESCRIPTION OF THE DRAWINGS

The following detailed description can be more fully understood when considered in conjunction with the drawings in which.

DETAILED DESCRIPTION

Introduction

In the following description, numerous specific details are set forth in order to provide a thorough understanding of the invention, which pertains to forming low resistivity tungsten/tungsten nitride layers. Preferred methods involve treating a tungsten or tungsten nitride layer to improve the adhesion of the layer to the underlying substrate, which will be described in detail below. Modifications, adaptations, or variations of specific methods and of structures shown herein will be apparent to those skilled in the art and are within the scope of this invention.

Aspects of certain embodiments of the invention are described below in more detail.

Processes

Tungsten nitride may be deposited on a substrate using pulsed nucleation layer (PNL) technology in which the substrate is exposed to alternating pulses of reactants. Tungsten nitride deposited with a PNL process provides an excellent adhesion and barrier layer for tungsten on various substrates, but the adhesion window is rather narrow: (1) it typically requires greater than 30 Angstroms of tungsten nitride to achieve satisfactory adhesion on dielectrics; and, (2) it has very poor adhesion performance with low resistivity tungsten layers. The adhesion typically fails at the substrate (e.g., a dielectric, such as silicon oxide) and tungsten nitride interface.

In the processes described herein, a tungsten or tungsten nitride layer is treated to improve its adhesion to the underlying substrate. Treatments include: (1) exposure to a plasma containing hydrogen, nitrogen, or combinations thereof and (2) exposure to a temperature above 150 degrees Celsius in an atmosphere containing hydrogen, nitrogen, or combinations thereof. After the tungsten or tungsten nitride layer is treated, low resistivity tungsten is deposited on the layer. These processes result in low resistivity tungsten/tungsten nitride layers with excellent adhesion to the substrate. Furthermore, these processes can provide ultra-thin tungsten nitride barrier layers with superior conformality for device features of 22 nm and smaller.

In certain applications, the low resistivity tungsten/tungsten nitride deposition processes described herein enables the use of tungsten vias (in place of copper). Though the bulk resistivity of tungsten is higher than that of copper, tungsten vias may be desirable due to integration issues of copper vias such as copper barrier and electrical migration. As devices continue to shrink, the barrier thickness becomes a dominant factor in a via's resistance. Low resistivity tungsten/tungsten nitride has comparable via resistance as the copper vias without integration issues associated with copper.

Figure 1:
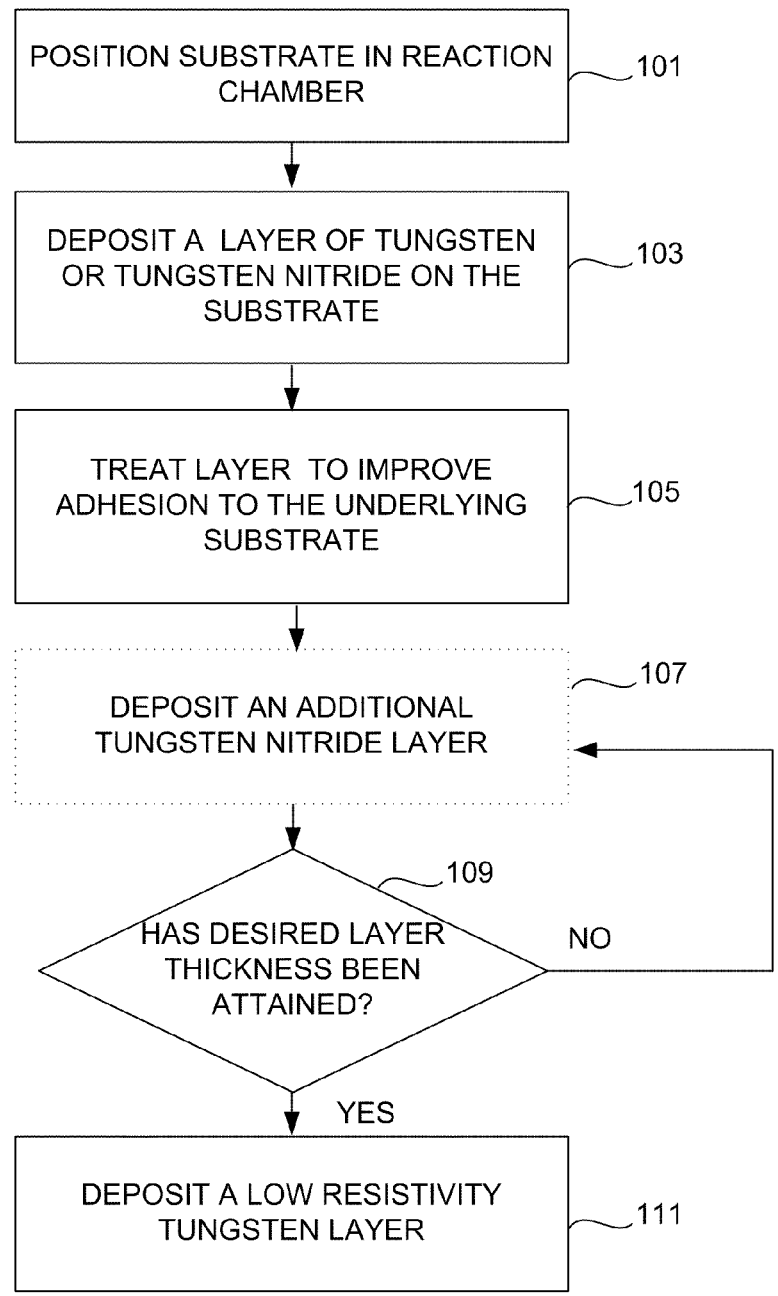
FIGS. 1 and 2 are process flow diagrams showing relevant operations or methods according to various embodiments of a process of forming low resistivity tungsten/tungsten nitride layers.

FIG. 1 is a process flow diagram depicting one process flow in accordance with certain embodiments of the invention. Initially, a substrate is provided and positioned in a reaction chamber as indicated in process operation 101. In many embodiments of the invention the substrate is a partially fabricated electronic device (e.g., a partially fabricated integrated circuit).

Next, as indicated in process operation 103, a layer of tungsten or tungsten nitride is deposited on the substrate. This layer is usually at least a monolayer, and may be a few monolayers of material or more, though other thicknesses such as less than one monolayer may be appropriate in some instances. The tungsten or tungsten nitride may be deposited with a chemical vapor deposition (CVD) or a PNL process. PNL is similar to atomic layer deposition (ALD) techniques reported in the literature but is generally distinguished from ALD by its higher operating pressure range (greater than 1 Torr) and its higher growth rate per cycle (greater than 1 monolayer layer growth per cycle). PNL processes as discussed herein encompass conventional ALD-type processes.

In an example of a tungsten PNL deposition process, the substrate surface is first exposed to a reducing agent so that the reducing agent is adsorbed or otherwise maintained on the substrate surface. The reducing agent can be any process-compatible compound capable of effectively reducing a tungsten precursor to produce a layer of metallic tungsten. Examples of suitable reducing agents include various boron-containing reducing agents, e.g., boranes such as borane ($BH_3$), diborane ($B_2H_6$), triborane, etc. Examples of other boron-containing reducing agents include boron halides (e.g. $BF_3$, $BCl_3$) with hydrogen. Other reducing agents include silicon hydrides such as silane and organic derivatives thereof.

After the layer of reducing agent has formed on the substrate surface, a tungsten-containing precursor gas is introduced to the substrate surface. The tungsten-containing precursor is reduced when it comes in contact with the adsorbed sacrificial layer on the substrate surface, forming a tungsten metal layer. Any suitable tungsten-containing precursor that can be reduced by the reducing agent sacrificial layer to produce a layer of tungsten metal in accordance with the invention can be used. Examples of suitable tungsten-containing precursors include $WF_6$, $WCl_6$, $W(CO)_6$, and combinations of these. $WF_6$ has been found to work particularly well with borane sacrificial layers. Various other tungsten precursors known to those of skill in the art may be used. Some of these are identified by R. G. Gordon, J. Barton, and Seigi Suh in *Materials, Technologies, and Reliability for Advanced Interconnects and Low-K Dielectrics II*, edited by S. Lahiri, (Mat. Res. Soc. Proc. 714E, Pittsburgh Pa., 2001), which is incorporated herein by reference for all purposes.

Alternatively, the tungsten-containing precursor may be introduced to the substrate before the reducing agent. The tungsten-containing precursor can adsorb onto the substrate surface to form a thin layer of tungsten-containing precursor (or tungsten-containing precursor moiety). Suitable tungsten-containing precursors are those can saturate the substrate surface, as by adsorption, and be reduced by a reducing agent to produce a layer of tungsten metal. Generally, the precursors mentioned above ($WF_6$, $WCl_6$, $W(CO)_6$, and combinations thereof) work well. After the tungsten-containing precursor is provided on the substrate surface, a reducing agent is introduced to the wafer surface. This reduces the adsorbed tungsten-containing precursor layer, forming a tungsten metal layer. Again, any suitable reducing agent that can reduce the adsorbed tungsten-containing precursor layer to produce a layer of tungsten metal in accordance with the invention can be used. Examples include the boron-containing reducing agents, preferably boranes, more preferably diborane ($B_2H_6$). Other examples include silanes and derivatives of silanes. Regardless of whether the process introduces a tungsten-containing precursor or a reducing agent first to the substrate, the result is the same: a tungsten layer. The process flow continues to process operation 105, unless a tungsten nitride layer, instead of a tungsten layer, is being formed.

To form tungsten nitride via a PNL process, the steps of forming a tungsten layer are performed. Then, once the tungsten metal layer has been formed, a nitrogen-containing gas is introduced to the substrate surface to convert at least an upper portion of the tungsten metal to tungsten nitride. In this application, tungsten nitride is defined as the tungsten nitride compound ($WN_2$) and non-stoichiometric compounds of tungsten and nitrogen. Examples of suitable nitrogen-containing gases include $N_2$, $NH_3$, $NF_3$, and $N_2H_4$. At most, this operation completely converts the tungsten layer to tungsten nitride. This process yields a conformal tungsten nitride barrier layer. A description of tungsten nitride PNL processes is given in U.S. Pat. No. 7,005,372, which is herein incorporated by reference for all purposes.

As mentioned above, CVD may be used to deposit a layer of tungsten or tungsten nitride on the substrate in process operation 103. CVD processes to deposit tungsten and tungsten nitride are described below.

The next process operation 105 in FIG. 1 involves treating the tungsten or tungsten nitride layer to improve the adhesion to the underlying substrate. In a typical semiconductor fabrication process, a portion of the underlying substrate has an oxide underlayer surface, such as silicon oxide dielectric, including silicon oxides formed with tetraethyl orthosilicate (TEOS), for example. Other portions of the underlying substrate may include silicon nitrides, silicides, silicon germanium, metals (including, for example, copper and tungsten), and other low-k dielectrics. Treatment processes include a plasma treatment and a temperature treatment.

In certain embodiment of the plasma treatment process, the tungsten or tungsten nitride layer is exposed to a plasma containing nitrogen, hydrogen, or combinations thereof. Sources of nitrogen include nitrogen gas ($N_2$), ammonia ($NH_3$), hydrazine ($N_2H_4$), and any other nitrogen containing molecules. Sources of hydrogen include hydrogen gas ($H_2$). In certain embodiments, forming gas is used. Argon may be present in the plasma treatment gas as a non-active species.

Typically, an inductively coupled plasma is used in the plasma treatment process. Plasmas generated with other power sources may also be used, including radio frequency (RF), DC, and microwave power sources.

In certain embodiments, treatment plasmas containing other active species may be used in addition to or in lieu of nitrogen or hydrogen containing plasmas. For example, it may be desirable to form a tungsten carbide layer or a tungsten or tungsten nitride layer that includes carbides. In such cases, methane ($CH_4$), other hydrocarbons, and any other carbon containing molecules may be used in the plasma. The actual species present in the plasma may be a mixture of different ions, atoms and molecules derived from the treatment gas or gases. The activated, or highly reactive, species in the plasma typically includes any or all of ions, radical species, or high energy molecular species.

In an alternative process, instead of depositing tungsten nitride and then treating the tungsten nitride with a plasma treatment process, the deposition and treatment may occur at the same time. This process is described below, with reference to FIG. 2.

The substrate may be biased or unbiased. In certain applications, the substrate is not biased during the plasma treatment process because sputtering or etching material is not desired. When treating a deposited tungsten or tungsten nitride layer that is 30 Angstroms or thicker, however, the substrate may need to be biased from 100 to 300 Watts. Without being bound by any theory, it is believed that the treatment process may remove residual fluorine from the interface of the deposited material and the substrate, which serves to improve adhesion. The fluorine is believed to be removed by the interaction of nitrogen or hydrogen with fluorine. Biasing the substrate when treating a thicker layer of deposited material may aid in nitrogen or hydrogen atoms reaching the interface.

Additionally, the plasma treatment process may be performed in-situ or downstream. In an in-situ plasma process, the substrate is directly exposed to plasma. A downstream plasma process is a plasma process in which the substrate is located away from plasma, and hence, is not directly exposed to plasma. Desired reactions with a downstream plasma process are implemented by extracting ionized or other activated species from the plasma and directing them toward the wafer. If using a downstream source, the activated species that exist at the plasma source may differ from the activated species that are eventually fed into the process chamber, due to recombination and reaction. By exposing the layer surface to a downstream plasma, rather than a plasma that is generated within the chamber containing the wafer, modifications that improve adhesion without significant sputtering or other undesirable reactions are facilitated. In many downstream plasma processes, there is no electrical potential across which ions may be accelerated (though as indicated above in certain embodiments, the substrate is biased.) Also, in certain embodiments, all or most of the ionic species in the plasma have relaxed or recombined at the point that the plasma-containing gases have reached the chamber from the downstream plasma source. In certain embodiments, radical species have the necessary energy to modify the surface through chemical reactions as desired, without ion implantation or sputtering. As sputtering and/or ion implantation of the substrate surface are generally not needed for the plasma treatment process (except as noted above), a downstream plasma treatment process is used in certain embodiments of the invention.

In the temperature treatment process, the tungsten or tungsten nitride layer is exposed to an elevated temperature (e.g., 150° C. or higher) while in an atmosphere containing nitrogen or hydrogen. Sources of nitrogen include nitrogen gas ($N_2$), ammonia ($NH_3$), hydrazine ($N_2H_4$), and any other nitrogen containing molecules. Sources of hydrogen include hydrogen gas ($H_2$). Combinations such as forming gas may be used. Argon may be present in the temperature treatment gas as a non-active species. In certain cases, it may be desirable to form a tungsten or tungsten nitride layer that includes a carbide. In such cases, methane ($CH_4$), other hydrocarbons, and any other carbon containing molecules may be used as a treatment gas or gases instead of or in addition to a nitrogen or hydrogen-containing gas.

In certain embodiments, a tungsten layer is treated with a nitrogen-containing plasma or, in the temperature treatment, while in an atmosphere containing nitrogen. These processes convert a portion of the tungsten to tungsten nitride. For example, in one process a tungsten layer is treated with a nitrogen or nitrogen and hydrogen containing plasma that serves to both convert a portion of the tungsten layer to tungsten nitride and improve adhesion. In some cases, however, it might be desirable not to convert a portion of the tungsten to tungsten nitrogen; this can be achieved by using a plasma or temperature treatment that does not incorporate nitrogen.

The above-described post-deposition treatments of tungsten or tungsten nitride barrier layers improve adhesion to the tungsten nitride layer and the low resistivity tungsten deposited on it to the underlying substrate. The treatment processes also decrease the resistivity of the tungsten or tungsten nitride layer.

Returning to FIG. 1, in process operation 107, an additional tungsten nitride layer is optionally deposited. PNL or CVD processes may be used. In certain embodiments, the same process used in process operation 103 is performed. In other embodiment, any suitable CVD process with any suitable tungsten-containing precursor and nitrogen-containing precursor may be used. In certain embodiments the tungsten precursor is one of $WF_6$, $WCl_6$ and $W(CO)_6$. The nitrogen containing precursor may be one of nitrogen gas ($N_2$), ammonia ($NH_3$), and any other nitrogen containing molecules. Frequently, the CVD process is performed using a mixture of molecular hydrogen, one or more of the tungsten-containing precursors, and one or more of the nitrogen-containing precursors. In other embodiments, the CVD process may employ a tungsten-containing precursor and a nitrogen-containing precursor together with silane, a mixture of hydrogen and silane, or a mixture of hydrogen and borane (such as diborane). An additional tungsten nitride layer of any thickness may be deposited, but typically an additional layer is about 10 to 30 Angstroms thick. In certain embodiments, the additional tungsten nitride layer does not need to be treated to improve adhesion, but it may optionally be treated. Additional treatment cycles may not be desirable in certain embodiments, however, because igniting a plasma generates particles that can contaminate the substrate surface. Alternatively, in process operation 107, additional tungsten layers instead of tungsten nitride layers are optionally deposited.

In process operation 109, process operation 107 is repeated until the desired layer thickness is attained. For example, the tungsten nitride layer produced in each deposition process operation 107 when PNL is used is about 5 to 10 Angstroms thick. Thus, for a desired layer thickness is about 20 to 30 Angstroms, 2 to 6 cycles of process operation 107 are performed. In other embodiments, a CVD process is used in process operation 107 to deposit tungsten nitride, as described above.

In some embodiments, the thickness of the tungsten nitride deposited in process operation 107 may be the same thickness as the thickness of the tungsten or tungsten nitride deposited in process operation 103. In other embodiments, the thickness of the tungsten nitride deposited in process operations 107 may be many times thicker than the thickness of the tungsten or tungsten nitride deposited in process operation 103. In further embodiments, process operation 107 is not performed. Once the desired layer thickness is attained, the process flow continues with process operation 111. The last process operation 111 involves depositing a low resistivity tungsten layer, described in more detail below, with reference to FIG. 3.

Figure 2:
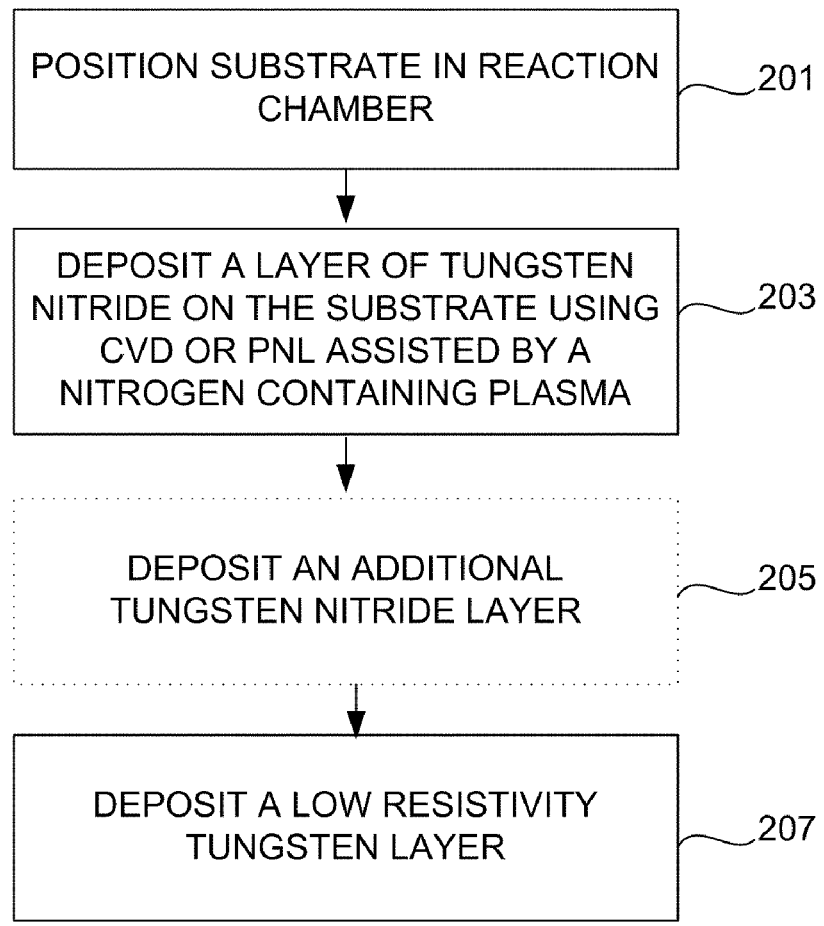

As noted above, the deposition and the treatment of tungsten nitride may be performed at the same time. This is depicted in FIG. 2, a process flow diagram showing one process flow in accordance with certain embodiments of the invention. Initially, a substrate is provided and positioned in a reaction chamber as indicated by process block 201. In process operation 203, a layer of tungsten nitride is deposited on the substrate using a PNL or CVD process assisted by a nitrogen containing plasma. The plasma serves to aid in the dissociation of precursor molecules and may also aid in the creation of large quantities of free radicals. In one embodiment, a layer of tungsten nitride 20 to 50 Angstroms thick is deposited. In a plasma enhanced PNL process, the plasma could be pulsed or ignited during the entire deposition process or during only certain reactant pulses. In preferred embodiments, the plasma is ignited during the entire deposition process as igniting the plasma generates particles that could contaminate the substrate. In many cases, a downstream plasma is used. In a plasma enhanced CVD (PECVD) process, the plasma may similarly be pulsed or ignited during the entire deposition process. After process operation 203, an additional tungsten nitride layer may be deposited in process operation 205. Then, in process operation 207, a low resistivity tungsten layer is deposited. In other embodiments, the plasma may be a hydrogen-containing or other treatment plasma, as described above. Plasma and/or thermal treatments may be performed simultaneously with the deposition or may partially overlay with the deposition.

Figure 3:
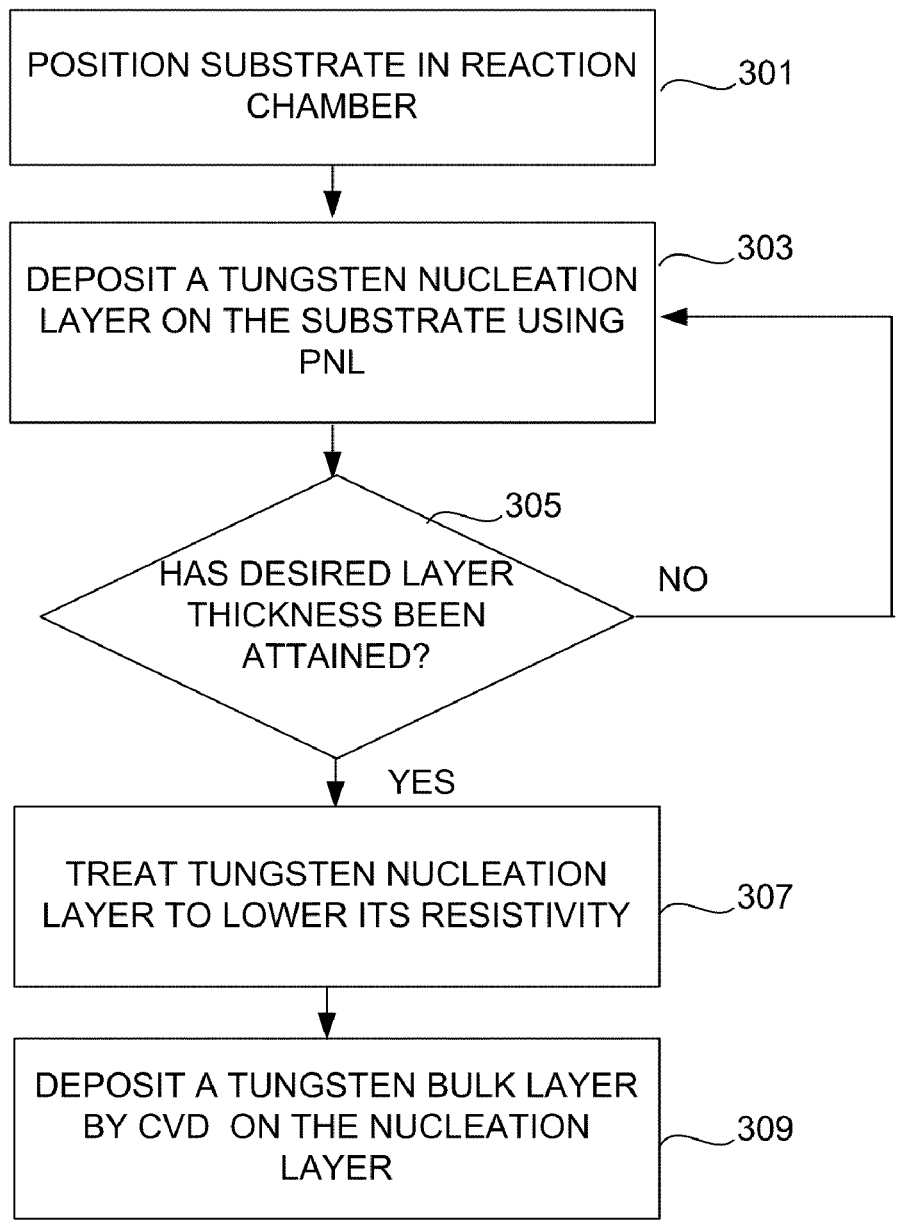
FIG. 3 is a process flow diagram showing relevant operations or methods for one process of forming a low resistivity tungsten layer.

In many embodiments, a low-resistivity tungsten layer is deposited on the tungsten nitride layer as depicted in operations 111 and 207, for example, to form low resistivity tungsten/tungsten nitride. FIG. 3 is a process flow diagram depicting a process flow for depositing a low resistivity tungsten layer. In process operation 301, a substrate is provided and positioned in a reaction chamber. Then, in process operation 303, a tungsten nucleation layer is deposited on the substrate. A tungsten nucleation layer is a thin conformal layer that facilitates growth of bulk tungsten. Tungsten nucleation layers typically have higher electrical resistivities than tungsten bulk layers. To keep the resistivity of the tungsten layer (i.e., tungsten nucleation layer and tungsten bulk layer) low, the tungsten nucleation layer should generally be kept as thin as possible. Tungsten nucleation layer thicknesses typically range from 5 to 50 Angstroms The tungsten nucleation layer may be deposited with a pulsed nucleation layer (PNL) technique. In a PNL deposition process, pulses of reducing agent, purge gases and tungsten-containing precursors are sequentially injected into and purged from the reaction chamber, as described above with respect to forming a tungsten layer. The process is repeated in a cyclical fashion until the desired nucleation layer thickness is achieved (process operation 305).

Additional discussion regarding PNL type processes to deposit tungsten nucleation layers can be found in commonly assigned U.S. patent application Ser. No. 11/265,531, filed Nov. 1, 2005, incorporated herein by reference in its entirety for all purposes. Additional discussion regarding PNL type processes can also be found in commonly assigned U.S. Pat. Nos. 6,844,258 and 7,141,494. Each of these patents is incorporated herein by reference in their entirety for all purposes. Additional methods of forming tungsten nucleation layers can be found in commonly assigned U.S. Pat. No. 6,905,543, incorporated herein by reference in its entirety for all purposes.

In process operation 307, the tungsten nucleation layer is treated to lower its resistivity. Possible treatments include exposure of the tungsten nucleation layer to pulses of reducing agent, such as a silane or a borane (e.g., diborane), or a high temperature treatment, both of which have been shown to lower the resistivity. After the desired tungsten nucleation layer thickness is attained and treated, bulk tungsten is deposited on the nucleation layer with CVD in process operation 309. In many embodiments, the tungsten bulk layer is deposited using a CVD process because CVD has been found to rapidly produce low resistivity tungsten layers. Any suitable CVD process with any suitable tungsten-containing precursor may be used. In certain embodiments the tungsten precursor is one of $WF_6$, $WCl_6$ and $W(CO)_6$. Frequently, the CVD process is performed using a mixture of molecular hydrogen and one or more of these precursors. In other embodiments, the CVD process may employ a tungsten precursor together with silane, a mixture of hydrogen and silane, or a mixture of hydrogen and borane (such as diborane). Non-CVD process can also be employed to form the tungsten bulk layer. These include ALD, PNL, or PVD. The resistivity of a tungsten layer (i.e., tungsten nucleation layer and tungsten bulk layer) deposited with the low-resistivity tungsten process is from about 10 $\mu\Omega$-cm to about 30 $\mu\Omega$-cm, but the resistivity does depend on the thickness of the layer.

The tungsten bulk layer can be deposited to any thickness. Tungsten interconnect lines for integrated circuit applications may have a total thickness (tungsten nucleation layer and tungsten bulk layer) of between about 20 and 1,000 Angstroms. For a typical bit line, the total tungsten layer thickness is typically no greater than about 500 Angstroms. After the tungsten layer is deposited to a sufficient thickness, the process flow of FIG. 3 is complete. Methods of depositing a low resistivity tungsten layer are more fully described in the following US patent applications: U.S. patent application Ser. No. 11/951,236, filed Dec. 5, 2007; U.S. patent application Ser. No. 12/407,541, filed Jun. 19, 2009; and, U.S. Patent Application Ser. No. 61/169,954, filed Apr. 16, 2009. Each of these applications is herein incorporated by reference for all purposes.

Figure 4:
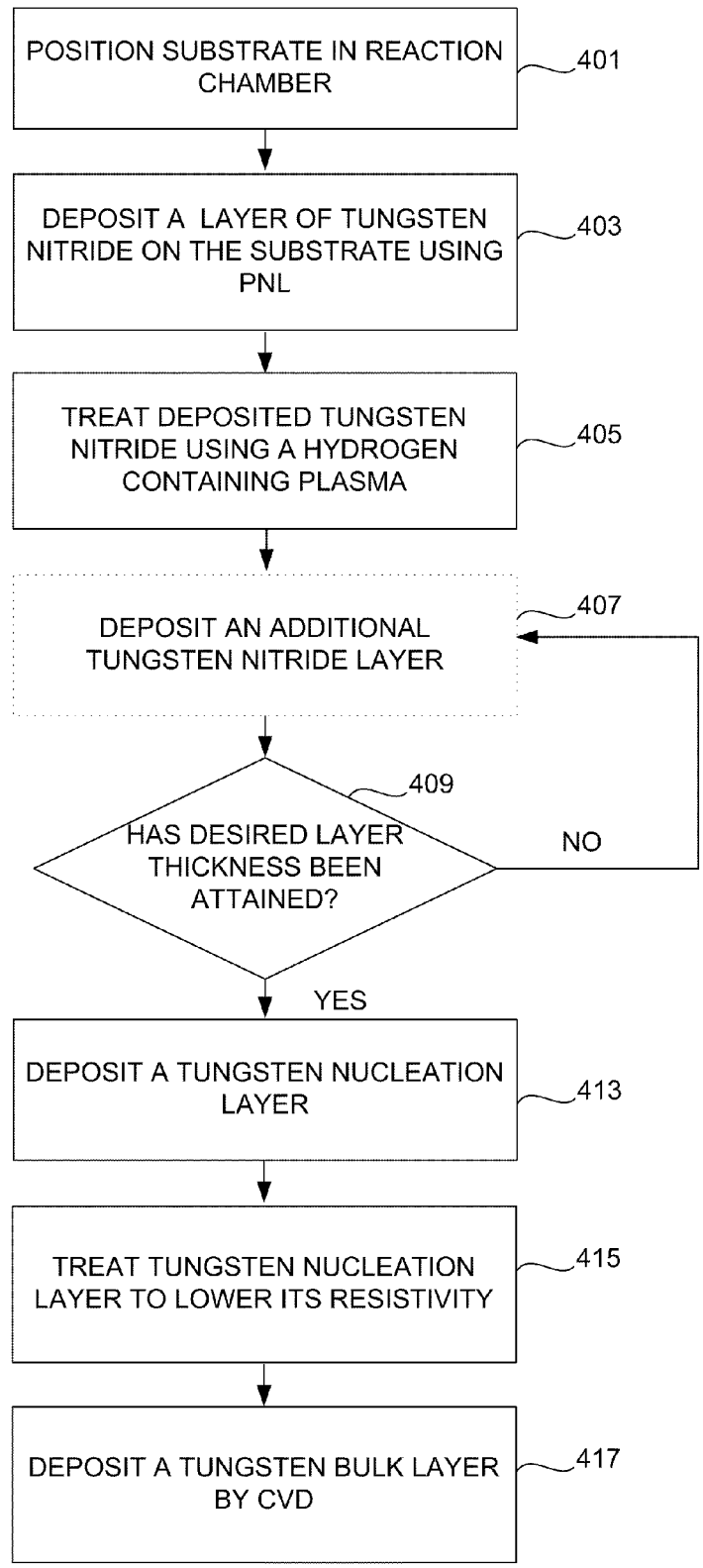
FIG. 4 is a process flow diagram showing relevant operations or methods according to a specific embodiment of a process of forming low resistivity tungsten/tungsten nitride layers.

FIG. 4 depicts a specific embodiment of the method depicted in FIG. 1. Initially, a substrate is provided and positioned in a reaction chamber as indicated in process operation 401. Next, as indicated in a process operation 403, a tungsten nitride layer is deposited on the substrate via a pulsed nucleation layer (PNL) process. As indicated in process operation 405, the tungsten nitride layer is treated with a hydrogen containing plasma to improve its adhesion to the substrate. In process operation 407, an additional tungsten nitride layer may be deposited. Process operation 407 is repeated until the desired tungsten nitride layer thickness is attained, as shown in process operation 409. A tungsten nucleation layer is then deposited on the substrate in process operation 413, as described above. After the tungsten nucleation layer is treated to lower its resistivity in process operation 415, a tungsten bulk layer is deposited by CVD thereon in operation 417.

Figure 5:
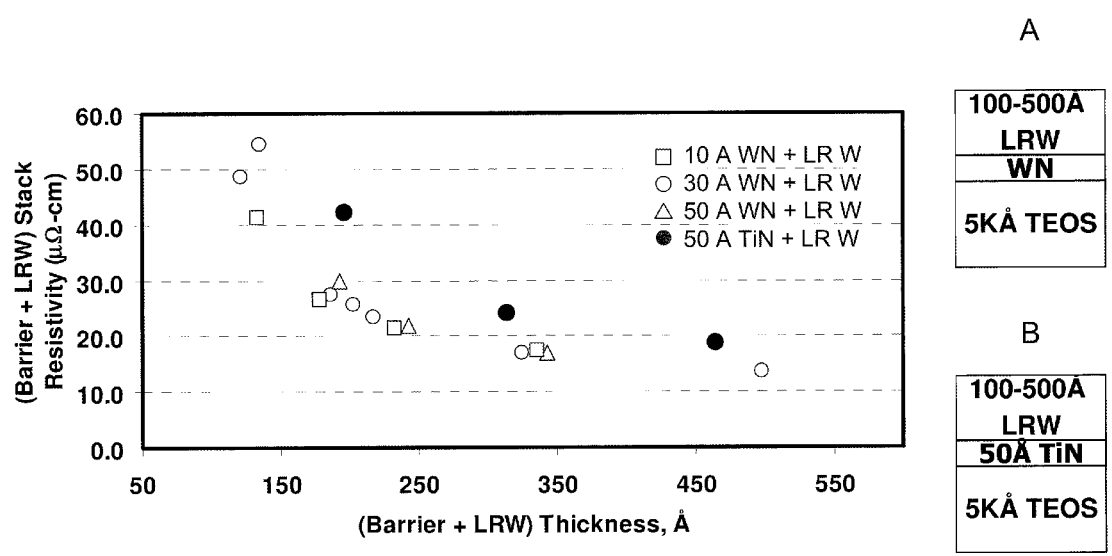
FIG. 5 is a graph of stack (i.e., barrier layer and low resistivity tungsten layer) resistivity versus stack thickness for three different thicknesses of tungsten nitride. These stacks were formed using an embodiment of the invention. A stack using titanium nitride for the barrier layer is shown for comparison.

FIG. 5 is a graph of the stack (i.e., the tungsten nitride layer and the low resistivity tungsten layer) resistivity ($\mu\Omega$-cm) versus the stack thickness for a number of different low resistivity tungsten/tungsten nitride stacks. Also shown on the graph are data points for a low resistivity tungsten/titanium nitride stack. For this stack, a 50 Angstrom titanium nitride barrier layer was formed in a low temperature CVD process using titanium tetrachloride (TiCl4). Depictions of the different stack components are shown in A and B in FIG. 5. "A" shows stacks with different thicknesses of tungsten nitride. Tungsten nitride (WN), with thicknesses of 10, 30, and 50 Angstroms, was deposited on a 5000 Angstrom thick silicon oxide under layer. Then, after treatment of the tungsten nitride to improve its adhesion to the under layer, different thickness of low resistivity tungsten (LRW) were deposited. "B" shows a stack formed by depositing 50 Angstroms of titanium nitride (TiN) on a 5000 Angstrom thick silicon oxide under layer. After deposition of the titanium nitride, different thicknesses of low resistivity tungsten were deposited.

The resistivity of a thin film is a function of its thickness (resistivity decreases as film thickness increases), until the film thickness reaches some critical value where the resistivity becomes constant. This is shown by the data in FIG. 5; the thinner stacks have a higher resistivity. For all of the low resistivity tungsten/tungsten nitride stacks in FIG. 5, the stack resistivity (for a given stack thickness) is lower than that of the low resistivity tungsten/titanium nitride stack. Also, the resistivity of the low resistivity tungsten/tungsten nitride stacks does not vary significantly with the tungsten nitride thickness.

EXAMPLES

Examples 1 and 2 are examples of processes used to form a low resistivity tungsten/tungsten nitride layer on a silicon oxide under layer. In example 1, the tungsten nitride is subjected to a plasma treatment process, as described above. In example 2, the tungsten nitride is not given any treatment.

Adhesion of the low resistivity tungsten/tungsten nitride layers was measured using a scribe/tape test according to ASTM standard D3359-08, Standard Test Methods for Measuring Adhesion by Tape Test. In a scribe/tape test, the tungsten layer is scribed with a diamond cutter, tape is placed over the scribed area, and then the tape is pulled off. "Pass" for adhesion indicates that the tungsten layer remained on the tungsten nitride barrier layer after a scribe/tape test, whereas "Fail" indicates that the tape removed portions of the tungsten layer.

Example 1

Plasma Treatment

A 30 Angstrom thick tungsten nitride layer was first deposited on a silicon oxide under layer using a PNL process. The substrate was kept and 325° C. during this process, and tungsten hexafluoride, diborane, and ammonia were used in the PNL process. A hydrogen plasma at 10 mTorr was used for the plasma treatment. After treatment, a tungsten nucleation layer was first deposited onto the tungsten nitride layer using a PNL process and then treated to lower its resistivity. Two different low resistivity tungsten/tungsten nitride layers, A and B, were formed using different low-resistivity treatments for the tungsten nucleation layer in this example. Tungsten nucleation layer treatment A comprised holding the substrate at a temperature of 300° C. and exposing the tungsten nucleation layer to alternating pulses of diborane and tungsten hexafluoride. Tungsten nucleation layer treatment B comprised holding the substrate at a temperature of 395° C. and exposing the tungsten nucleation layer to alternating pulses of diborane and tungsten hexafluoride. This was followed by a tungsten bulk layer deposited using CVD, resulting in a tungsten layer 1500 Angstroms thick. The process conditions used in this example are also shown in Table I.

TABLE I

Process conditions used to deposit low resistivity tungsten/tungsten nitride in example 1.

| Layer | Temperature (C.) | Pressure (Torr) | Thickness (A) | Gas Used |
|---|---|---|---|---|
| WN | 325 | 3 | 30 | WF6, B2H6, NH3 |
| Plasma treatment | 150 | 10 mTorr | NA | H2 |
| W | 300 C. for nucleation layer, 395 C. for bulk W layer | 40 | 1500 | B2H6, WF6, H2 |

For one low-resistivity treatment process, A, of the tungsten nucleation layer, the tungsten nucleation layer and tungsten bulk layer had a resistivity of 13.4 mΩ-cm at a 1000 Å thickness. For another low-resistivity treatment process, B, of the tungsten nucleation layer, the tungsten nucleation layer and tungsten bulk layer had a resistivity of 10.7 mΩ-cm at 900 Å thickness. Both of these low resistivity tungsten/tungsten nitride layers passed the scribe/tape test.

Generally, the resistivity of the deposited tungsten or tungsten nitride layer treated with embodiments of the invention and the low resistivity tungsten layer is less than about 15 mΩ-cm at 1500 Angstroms.

Example 2

No Adhesion Treatment

A 55 Angstrom thick tungsten nitride layer was first deposited on a silicon oxide under layer using a PNL process. The substrate was kept and 325° C. during this process, and tungsten hexafluoride, diborane, and ammonia were used in the PNL process. The tungsten nitride layer was not treated prior to the deposition of the low resistivity tungsten layer. A tungsten nucleation layer was first deposited onto the tungsten nitride layer using a PNL process, and then treated to lower its resistivity. The tungsten nucleation layer treatment comprised holding the substrate at a temperature of 300° C. and exposing the tungsten nucleation layer to alternating pulses of diborane and tungsten hexafluoride. Then, a tungsten bulk layer deposited using CVD, resulting in a tungsten layer 1500 Angstroms thick. The process conditions used in this example are also shown in Table II.

TABLE II

Process conditions used to deposit low resistivity tungsten/tungsten nitride in example 2.

| Layer | Temperature (C.) | Pressure (Torr) | Thickness (A) | Gas Used |
|---|---|---|---|---|
| WN | 325 | 3 | 55 | WF6, B2H6, NH3 |
| W | 300 C. for nucleation layer, 395 C. for bulk W layer | 40 | 1500 | B2H6, WF6, H2 |

The tungsten nucleation layer and tungsten bulk layer had a resistivity of 12 Ω-cm at a 1500 Å thickness. This low resistivity tungsten/tungsten nitride layer failed the scribe/tape test.

Apparatus

The methods of the invention may be carried out in various types of deposition apparatuses available from various vendors. Examples of suitable apparatuses include a Concept 2 Altus, a Concept-2 Altus-S, a Concept 3 Altus, a Concept 3 Altus Directfill, and a Concept 2 Altus Directfill deposition system, all available from Novellus Systems, Inc. of San Jose, Calif., or any of a variety of other commercially available CVD processing systems. In some cases, the process may be performed on multiple deposition stations within the same deposition apparatus sequentially. See, e.g., U.S. Pat. No. 6,143,082, which is incorporated herein by reference for all purposes. In some embodiments, the tungsten or tungsten nitride deposition processes are performed at a first station or at first and second stations that are one of two, four, five or even more deposition stations positioned within a single deposition apparatus. The other process operations may be performed at the remaining stations. The process gases for each process operation are introduced to the surface of the semiconductor substrate at a station using an individual gas supply system that creates a localized atmosphere at the substrate surface. Alternatively, each process or groups of processes could be preformed in a different deposition apparatus.

Figure 6:
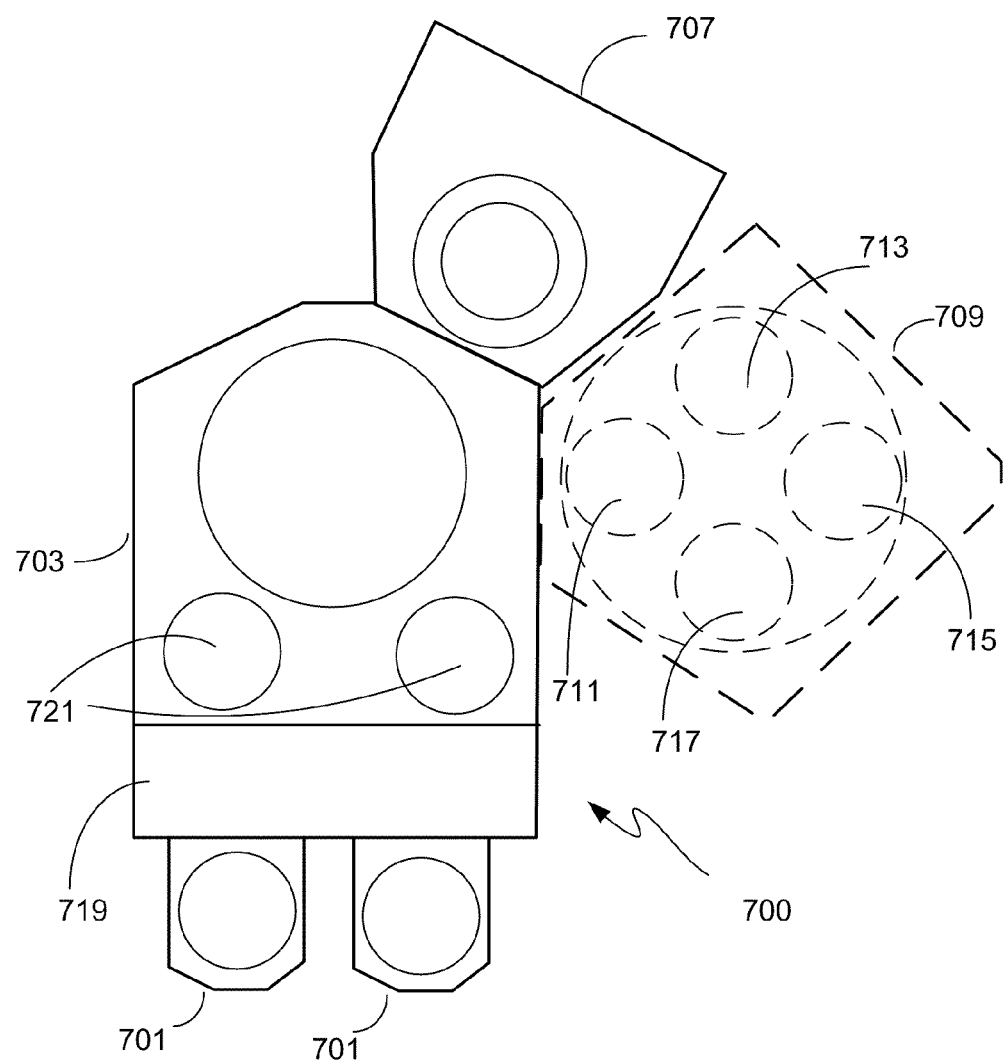
FIG. 6 is a block diagram of a processing system suitable for producing low resistivity tungsten/tungsten nitride layers in accordance with embodiments of the invention.

FIG. 6 is a block diagram of a CVD processing system suitable for conducting tungsten or tungsten nitride deposition and treatment processes in accordance with embodiments of the invention. The system 700 includes a transfer module 703. The transfer module 703 provides a clean, pressurized environment to minimize the risk of contamination of substrates being processed as they are moved between the various reactor modules. Mounted on the transfer module 703 is a multi-station reactor 709 capable of performing tungsten or tungsten nitride deposition, treatment, and low resistivity tungsten deposition according to embodiments of the invention. Chamber 709 may include multiple stations 711, 713, 715, and 717 that may sequentially perform these operations. For example, chamber 709 could be configured such that station 711 performs tungsten nitride deposition, station 713 performs a plasma treatment, station 715 performs tungsten nucleation layer deposition and treatment, and station 717 performs bulk tungsten CVD.

Also mounted on the transfer module 703 may be one or more single or multi-station modules 707 capable of performing plasma or chemical (non-plasma) pre-cleans. The module may also be used for various other treatments, e.g., post liner tungsten nitride treatments. The system 700 also includes one or more (in this case two) wafer source modules 701 where wafers are stored before and after processing. An atmospheric robot (not shown) in the atmospheric transfer chamber 719 first removes wafers from the source modules 701 to loadlocks 721. A wafer transfer device (generally a robot arm unit) in the transfer module 703 moves the wafers from loadlocks 721 to and among the modules mounted on the transfer module 703.

In certain embodiments, a system controller is employed to control process conditions during deposition and treatment. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, plasma power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition, treatment, and other processes in a process sequence can be written in any conventional computer readable programming language; for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as plasma power levels, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition and treatment processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

The foregoing describes implementation of embodiments of the invention in a single or multi-chamber semiconductor processing tool.

OTHER EMBODIMENTS

While this invention has been described in terms of several embodiments, there are alterations, modifications, permutations and substitute equivalents which fall within the scope of the invention. It should also be noted that there are many alternative ways of implementing the methods and apparatuses of the invention. It is therefore intended that the following appended claims be interpreted as including all such alterations, modification, permutations, and substitute equivalents as fall within the true spirit and scope of embodiments of the invention.

Embodiments of the invention have been described for forming low resistivity tungsten/tungsten nitride layers with low resistivity and good adhesion. The methods as described herein may also be applicable to forming other metallic layers, including copper with copper nitride and aluminum with aluminum nitride, with low resistivity and good adhesion.

What is claimed is:

1. A method comprising:
   (a) providing a semiconductor device substrate in a reaction chamber;
   (b) depositing on the semiconductor device substrate a layer of material to a thickness of at least about 30 Angstroms, wherein the material is selected from the group consisting of tungsten and tungsten nitride; and
   (c) treating the layer of material with the semiconductor device substrate being biased from about 100 Watts to about 300 Watts with a plasma containing nitrogen, hydrogen, or combinations thereof.

2. The method of claim 1, further comprising:
   depositing a low resistivity tungsten layer on the layer of material, wherein depositing the low resistivity tungsten layer comprises:
     depositing a tungsten nucleation layer on the layer of material,
     treating the tungsten nucleation layer to lower its resistivity, and
     depositing a tungsten bulk layer on the tungsten nucleation layer by a chemical vapor deposition process.

3. The method of claim 2 wherein the resistivity of the layer of material and the low resistivity tungsten layer is less than about 15 microohms-cm at 1500 Angstroms.

4. The method of claim 1 wherein operation (b) is performed by a pulsed nucleation layer process.

5. The method of claim 1 wherein operation (b) is performed by a chemical vapor deposition process.

6. The method of claim 1 further comprising:
   depositing a layer of tungsten nitride after operation (c).

7. The method of claim 1 wherein operation (b) is repeated, after operation (c), until a desired thickness of material is achieved.

8. The method of claim 1, wherein operation (c) is performed with a downstream plasma process.

9. The method of claim 1 wherein the nitrogen for the plasma is provided from one of the group of chemicals consisting of nitrogen gas, ammonia, and hydrazine.

10. The method of claim 1 wherein a nitrogen or hydrogen-containing plasma is ignited during operation (b), and wherein the nitrogen or hydrogen-containing plasma aids in the dissociation of precursor molecules.

11. The method of claim 10 wherein nitrogen for the plasma in operation (b) is provided from one of the group of chemicals consisting of nitrogen gas, ammonia, and hydrazine.

12. The method of claim 10 wherein the plasma in operation (b) is an inductively coupled plasma.

13. The method of claim 10 wherein the layer of material is a layer of tungsten nitride, and wherein the layer of tungsten nitride is less than about 50 Angstroms thick.

14. The method of claim 1 wherein the plasma further contains carbon.

15. The method of claim 14 wherein the carbon is provided by a hydrocarbon or methane.

* * * * *